United States Patent
An et al.

(10) Patent No.: US 10,386,949 B2
(45) Date of Patent: Aug. 20, 2019

(54) DISPLAY PANEL AND TOUCH DISPLAY DEVICE

(71) Applicant: LG Display Co., Ltd., Seoul (KR)

(72) Inventors: SuChang An, Seoul (KR); JiHyun Jung, Paju-si (KR); DeukSu Lee, Goyang-si (KR); JaeGyun Lee, Paju-si (KR); RuDa Lee, Seongnam-si (KR); HyangMyoung Gwon, Paju-si (KR); YangSik Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 103 days.

(21) Appl. No.: 15/665,255

(22) Filed: Jul. 31, 2017

(65) Prior Publication Data
US 2018/0143717 A1  May 24, 2018

(30) Foreign Application Priority Data
Nov. 23, 2016 (KR) .......... 10-2016-0156885

(51) Int. Cl.
  *G06F 3/041* (2006.01)
  *G06F 3/044* (2006.01)
  *H01L 27/32* (2006.01)

(52) U.S. Cl.
  CPC ............ *G06F 3/0412* (2013.01); *G06F 3/041* (2013.01); *G06F 3/044* (2013.01); *G06F 3/0416* (2013.01); *H01L 27/323* (2013.01); *G06F 2203/04111* (2013.01); *G06F 2203/04112* (2013.01)

(58) Field of Classification Search
  CPC ........ G06F 3/041; G06F 3/0416; G06F 3/044; G06F 2203/04111; G06F 2203/04112; G06F 3/0412; H01L 27/323
  See application file for complete search history.

(56) References Cited

U.S. PATENT DOCUMENTS

| | | | |
|---|---|---|---|
| 6,879,319 B2* | 4/2005 | Cok | G06F 3/0412 345/173 |
| 2011/0316809 A1 | 12/2011 | Kim et al. | |
| 2012/0154308 A1 | 6/2012 | Jeon et al. | |
| 2015/0097802 A1 | 4/2015 | Kim et al. | |
| 2015/0311477 A1* | 10/2015 | Cho | H01L 51/5284 257/40 |
| 2015/0378486 A1 | 12/2015 | Yu et al. | |
| 2016/0170524 A1 | 6/2016 | Kim et al. | |
| 2016/0204171 A1* | 7/2016 | Lee | H01L 51/5228 257/40 |
| 2016/0299611 A1* | 10/2016 | Park | H01L 51/5237 |

FOREIGN PATENT DOCUMENTS

EP    2 650 762 A2    10/2013

* cited by examiner

*Primary Examiner* — Muhammad N Edun
(74) *Attorney, Agent, or Firm* — Fenwick & West LLP

(57) ABSTRACT

A display panel and a touch display device are disclosed herein. In one embodiment, the display panel includes data lines, gate lines, subpixels defined by the data lines and the gate lines, and touch sensors, and a touch sensing circuit sensing a touch or a touched position using the touch sensors. Each of the touch sensors is located on an encapsulation layer and comprises two or more sub-electrodes located on different layers, where the two or more sub-electrodes are electrically connected to each other.

23 Claims, 30 Drawing Sheets

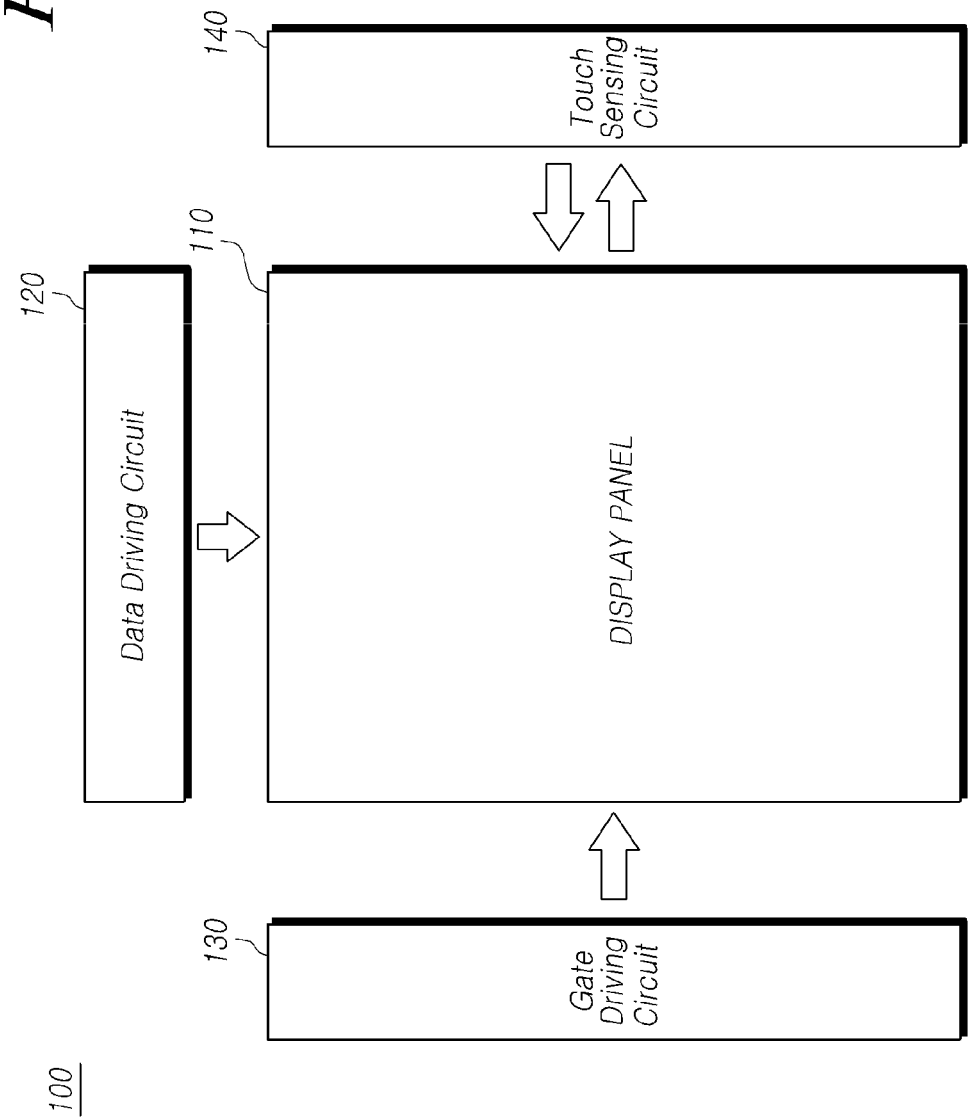

BULK TYPE

MESH TYPE

DISPLAY PANEL AND TOUCH DISPLAY DEVICE

CROSS REFERENCE TO RELATED APPLICATION

This application claims priority from Korean Patent Application No. 10-2016-0156885 filed on Nov. 23, 2016, which is hereby incorporated by reference for all purposes as if fully set forth herein.

BACKGROUND

Field

The present disclosure relates to a display panel and a touch display device having a built-in touch panel.

Description of Related Art

In response to the development of the information society, demand for a variety of display devices for displaying images is increasing. For example, a range of display devices, such as liquid crystal display (LCD) devices, plasma display panels (PDPs), and organic light-emitting diode (OLED) display devices, have been developed.

Many display devices provide touch-based user interfaces enabling users to intuitively and conveniently input data or instructions directly to devices, rather than using conventional data input systems, such as buttons, a keyboard, or a mouse.

To provide such touch-based user interfaces, the ability to sense a touch by a user and to accurately detect coordinates of the touch is required.

To detect touches made to touch panels (also referred to as touchscreen panels) by users, a touch sensing method such as a resistive touch sensing using a resistive film, capacitive touch sensing, electromagnetic induction touch sensing, infrared (IR) touch sensing, or ultrasonic touch sensing, may be used.

Among various touch sensing methods, capacitance touch sensing is commonly used to sense a touch and determine touch coordinates, using a plurality of touch electrodes disposed on a touch panel as touch sensors, based on a change in capacitance between touch electrodes or between a touch electrode and a pointer, such as a finger.

Various methods of disposing a touch panel including electrodes in a display panel have been used in order to facilitate the fabrication of display devices and reduce the sizes of display devices.

Among a variety of display devices, OLED display devices can be fabricated to be relatively light compared to the other display devices, since OLEDs or organic electroluminescent (EL) devices able to emit light themselves are used therein and a separate light source is not required.

In addition, OLED display devices are not only advantageous in terms of power consumption, since they are driven at low voltages, but also have desirable qualities, such as the ability to implement a range of colors of light, rapid response rates, wide viewing angles, and high contrast ratios. Thus, OLED display devices for next-generation displays have been actively researched.

Although OLED display devices are significantly advantageous in terms of display, there are significant difficulties and a range of limitations regarding touch panels to be disposed within OLED display devices.

For example, an encapsulation layer or the like for protecting the OLED display panel from moisture, air, physical impacts, or impurities that would be created during fabrication processing may be provided on the front surface of the OLED display panel to make the OLED display panel reliable. However, this consequently causes processing to be relatively complicated and difficult. In addition, the encapsulation layer makes it difficult to determine the positions of touch sensors without lowering display performance.

In addition, high temperature processing for implementing touch sensors including a metal material may damage organic materials in the OLED display panel.

As a result, it is difficult to dispose touch electrodes acting as touch sensors within OLED display panels. That is, it is significantly difficult to realize OLED display panels having a built-in touch panel.

Thus, in OLED display devices of the related art, a touch structure has been realized by attaching a touch panel to an OLED display panel rather than disposing the touch panel within the OLED display panel.

In such a case, the touch panel is fabricated separately from the OLED display panel before being attached to the OLED display panel, thereby complex fabrication processing and increased thickness of a resultant OLED display device.

BRIEF SUMMARY

Various aspects of the present disclosure provide a display panel and a touch display device including a built-in touch panel. The touch panel includes touch sensors disposed on an encapsulation layer in a touch-on-encapsulation (TOE) structure.

Also provided are a display panel and a touch display device, each of which has a touch structure able to reduce RC delay and improve touch sensitivity.

Also provided are a display panel and a touch display device, each of which has a touch structure allowing a large panel to be realized.

Also provided are a display panel and a touch display device, each of which allows mobile devices and wearable devices requiring a thinner encapsulation layer and higher touch sensitivity to be realized.

According to an aspect of the present disclosure, a touch display device comprises a display panel comprising data lines, gate lines, subpixels defined by the data lines and the gate lines, and touch sensors, and a touch sensing circuit sensing a touch or a touched position using the touch sensors. Each of the touch sensors is located on an encapsulation layer and comprises two or more sub-electrodes located on different layers, the two or more sub-electrodes electrically connected to each other.

In one or more embodiments, one of the two or more sub-electrodes is disposed directly on the encapsulation layer.

In one or more embodiments, the encapsulation layer is disposed between one of the two or more sub-electrodes and an organic light emitting diode.

In one or more embodiments, the touch sensors include amorphous transparent conductive materials formed by a low temperature deposition process at a process temperature of 100° C. or less.

In one or more embodiments, the display panel further comprises signal lines electrically connected to at least a subset of the touch sensors. The signal lines may be located on the encapsulation layer. Each of the signal lines may comprise two or more sub-lines.

In one or more embodiments, the touch sensors comprise driving electrodes and sensing electrodes. Two or more of the driving electrodes disposed in a first direction may be electrically connected to each other via one or more driving bridges, and the two or more of the driving electrodes may be electrically connected to a corresponding driving signal line. Two or more of the sensing electrodes disposed in a second direction may be electrically connected to each other via one or more sensing bridges, and the two or more of the sensing electrodes may be electrically connected to a corresponding sensing signal line. The one or more driving bridges and the one or more sensing bridges may be located on different layers of the two or more sub-electrodes. The touch sensing circuit may supply touch driving signals to driving signal lines and sense the touch or the touched position based on touch sensing signals received through sensing signal lines in response to the touch driving signals.

In one or more embodiments, the touch sensors are electrically isolated from each other, where each of the touch sensors may be electrically connected to a corresponding signal line. The touch sensing circuit may supply touch driving signals to signal lines and may sense the touch or the touched position based on touch sensing signals received through the signal lines in response to the touch driving signals.

In one or more embodiments, each of the touch sensors comprises a transparent electrode without any open area within the transparent electrode.

In one or more embodiments, each of the touch sensors comprises a mesh type electrode having one or more open areas, each of the one or more open areas corresponding to a corresponding light-emitting area of the subpixels.

In one or more embodiments, a transparent electrode is disposed on or below a corresponding one of the touch sensors or is disposed between two sub-electrodes from the two or more sub-electrodes of the corresponding one of the touch sensors. The transparent electrode may have a greater area than the two or more sub-electrodes.

In one or more embodiments, a passivation layer is located on the touch sensors.

In one or more embodiments, a buffer layer is disposed between (i) the encapsulation layer and (ii) the touch sensors.

According to an aspect of the present disclosure, a touch display panel includes subpixels defined by data lines and gate lines, where each subpixel includes an organic light-emitting diode comprising a first electrode, an organic light-emitting layer, and a second electrode, and a driving transistor for driving the organic light-emitting diode. The touch display panel further includes an encapsulation layer located on the second electrode of the organic light-emitting diode and touch sensors for touch sensing disposed on the encapsulation layer. Each of the touch sensors comprises two or more sub-electrodes located on different layers, the two or more sub-electrodes electrically connected to each other In one or more embodiments, one of the two or more sub-electrodes is disposed directly on the encapsulation layer.

In one or more embodiments, the encapsulation layer is disposed between one of the two or more sub-electrodes and the organic light emitting diode.

In one or more embodiments, the touch sensors include amorphous transparent conductive materials formed by a low temperature deposition process at a process temperature of 100° C. or less.

In one or more embodiments, a transparent electrode is disposed on or below a corresponding one of the touch sensors or is disposed between two sub-electrodes from the two or more sub-electrodes of the corresponding one of the touch sensors. The transparent electrode may have a greater area than the two or more sub-electrodes.

In one or more embodiments, a passivation layer is located on the touch sensors.

In one or more embodiments, a buffer layer is disposed between (i) the encapsulation layer and (ii) the touch sensors.

In one or more embodiments, a thickness of the encapsulation layer is 5 µm or greater.

BRIEF DESCRIPTION OF THE DRAWINGS

The above and other objects, features and advantages of the present disclosure will be more clearly understood from the following detailed description when taken in conjunction with the accompanying drawings, in which:

FIG. 1 is a schematic view illustrating the configuration of a touch display device according to exemplary embodiments;

DETAILED DESCRIPTION

Figure 2A:
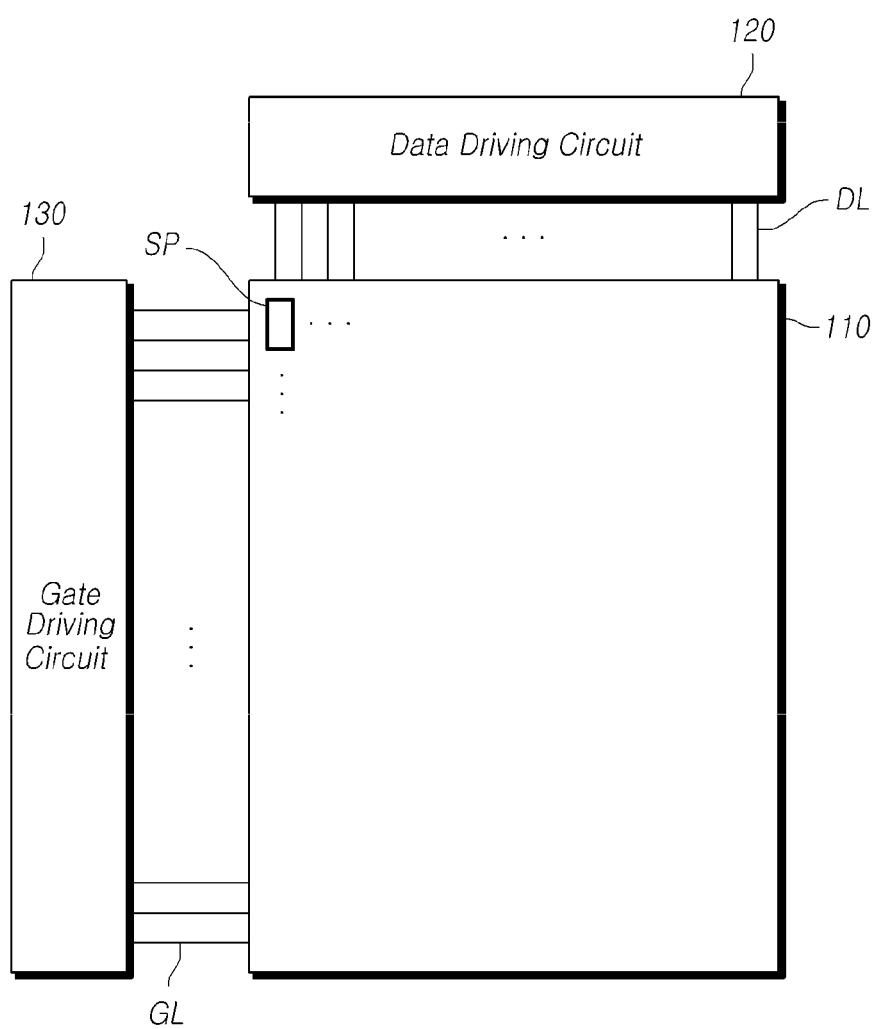
FIG. 2A illustrates a display panel according to exemplary embodiments.

Hereinafter, reference will be made to exemplary embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

Figure 2B:
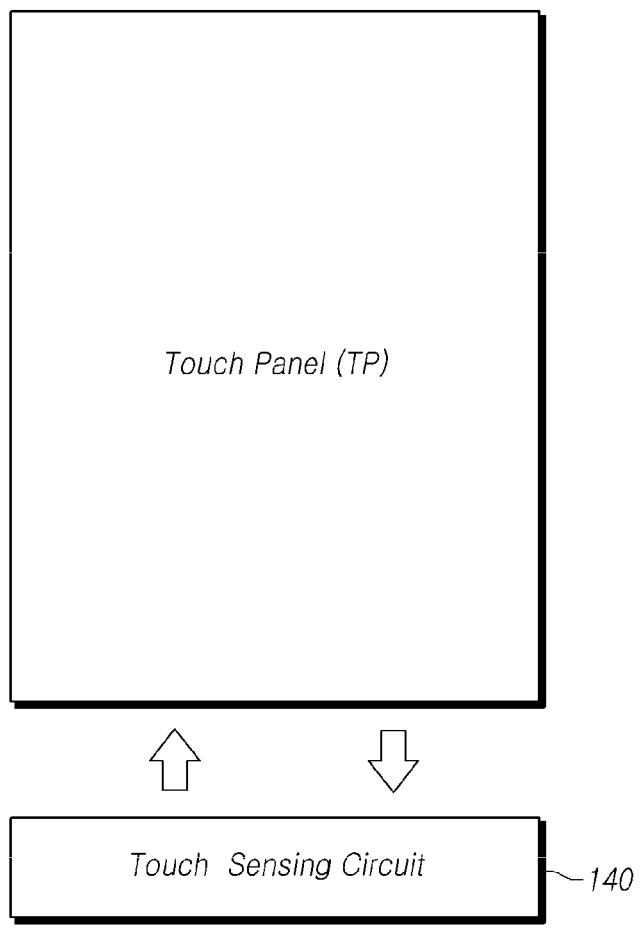
FIG. 2B illustrates a built-in touch panel provided in the display panel according to exemplary embodiments.

FIG. 1 is a schematic view illustrating the configuration of a touch display device 100 according to exemplary embodiments, FIG. 2A illustrates a display panel 110 according to exemplary embodiments, and FIG. 2B illustrates a built-in touch panel (or a built-in touchscreen panel) TP provided in the display panel 110 according to exemplary embodiments.

The touch display device 100 according to exemplary embodiments further includes, in addition to the display panel 110, a data driving circuit 120, a gate driving circuit 130, and a touch sensing circuit 140.

The display panel 110 has data lines DL and gate lines GL, as well as subpixels SP defined by the data lines DL and the gate lines GL, to display images.

The data driving circuit 120 drives the data lines DL of the display panel 110.

For example, the data driving circuit 120 can supply data voltages to the data lines during a display section.

The gate driving circuit 130 drives the gate lines GL of the display panel 110.

For example, the gate driving circuit 130 can sequentially supply scanning signals to the gate lines during the display section.

The display panel 110 can also act as the touch panel TP within which touch sensors are disposed to perform touch sensing.

In this regard, the display panel 110 may have built-in touch sensors (i.e., touch electrodes) disposed therein.

Thus, the touch panel TP may be provided as a built-in component of the display panel 110.

Here, the touch panel TP is a part of the display panel 110 that is required for touch sensing, and may refer to an assembly of touch sensors provided in the display panel 110.

The touch sensing circuit 140 senses a touch by a user and/or a touched position using the touch sensors provided in the display panel 110.

The touch panel TP according to exemplary embodiments may have a mutual capacitance-based touch structure or a self-capacitance-based touch structure.

When the touch panel TP according to exemplary embodiments has a mutual capacitance-based touch structure, the touch sensors of the touch panel TP are categorized as driving electrodes (also referred to as transmitting electrodes) and sensing electrodes (also referred to as receiving electrodes), depending on the role and function thereof.

In this case, the touch sensing circuit 140 supplies touch driving signals to the touch sensors corresponding to the driving electrodes and senses a touch and/or touch coordinates, based on touch sensing signals received from the touch sensors corresponding to the sensing electrodes.

When the touch panel TP according to exemplary embodiments has a self-capacitance-based touch structure, each of the touch sensors of the touch panel TP functions as both a driving electrode (or a transmitting electrode) and a sensing electrode (or a receiving electrode).

Thus, the touch sensing circuit 140 supplies touch driving signals to the touch sensors, receives (or detects) touch sensing signals from the touch sensors to which the touch driving signals have been supplied, and senses a touch and/or touch coordinates, based on the received (or detected) touch sensing signals.

The touch display device 100 according to exemplary embodiments displays images using organic light-emitting diodes (OLEDs) or organic electroluminescent (EL) devices.

Hereinafter, a subpixel structure (or a subpixel circuit) in the display panel 110 for displaying images using OLEDs will be described.

Figure 3A:
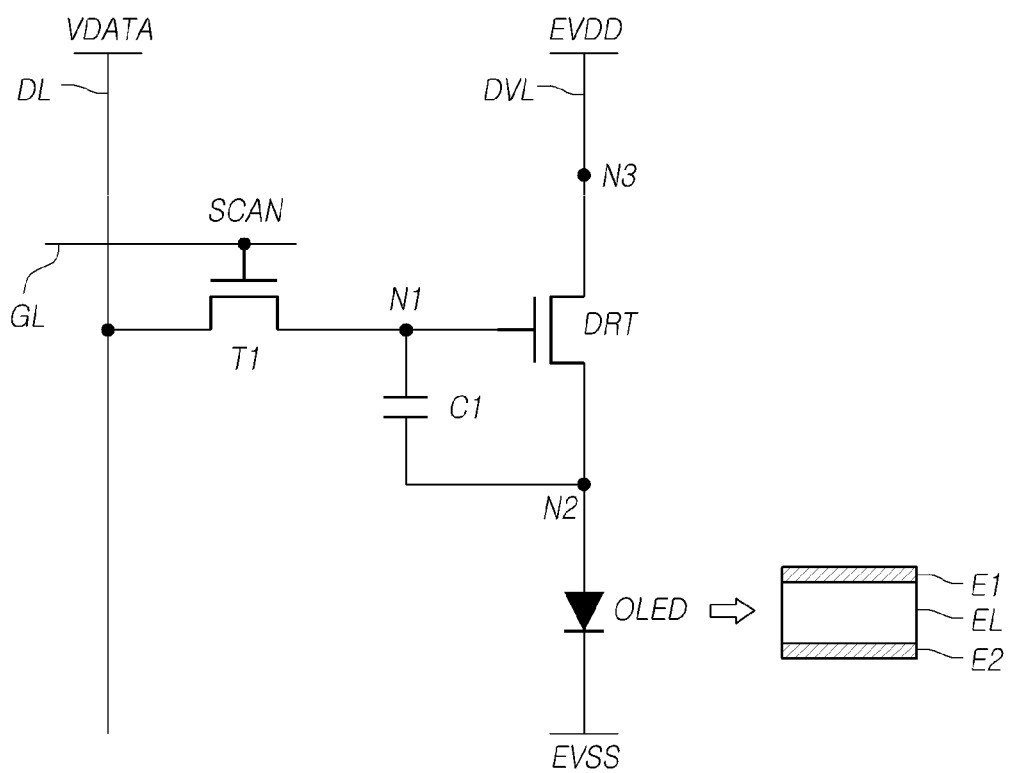
FIG. 3A and FIG. 3B are schematic circuit diagrams illustrating a subpixel circuit in the display panel according to exemplary embodiments.
Figure 3B:
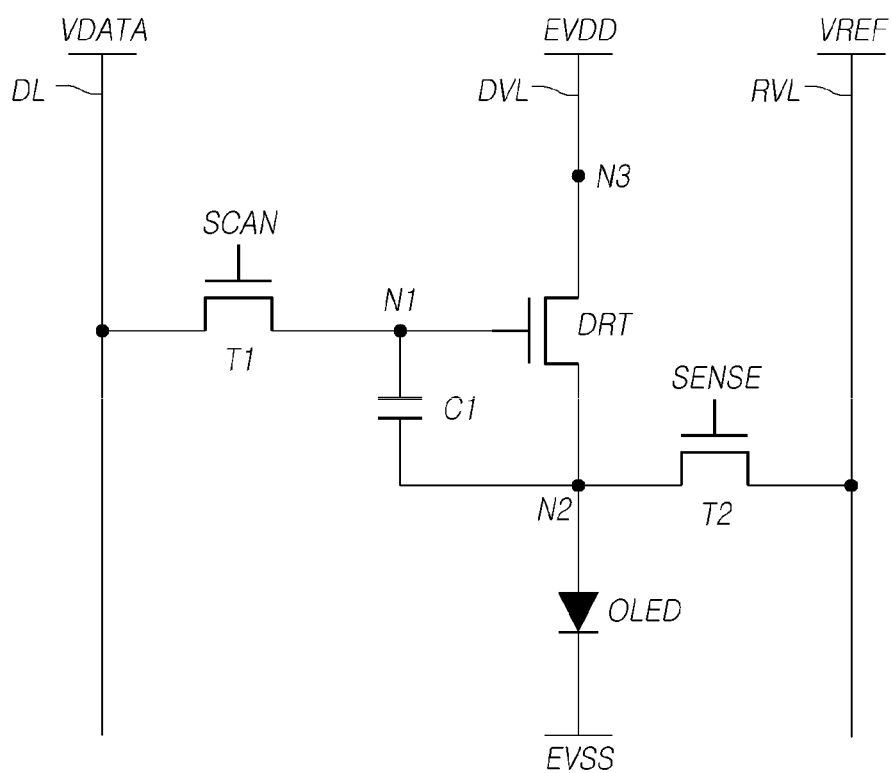

FIG. 3A and FIG. 3B are schematic circuit diagrams illustrating a subpixel circuit in the display panel 110 according to exemplary embodiments.

Referring to FIG. 3A and FIG. 3B, each of the subpixels SP includes, basically, an OLED and a driving transistor DRT driving the OLED.

Referring to FIG. 3A, each of the subpixels SP further includes a first transistor T1 delivering a data voltage VDATA to a first node N1 of the driving transistor DRT corresponding to a gate node and a storage capacitor C1 maintaining the data voltage VDATA corresponding to an image signal voltage or a voltage corresponding to the data voltage VDATA for the period of a single frame.

The OLED includes a first electrode (e.g., an anode or a cathode) E1, an organic light-emitting layer EL, and a second electrode (e.g., a cathode or an anode) E2.

For example, a base voltage EVSS is applied to the second electrode E2 of the OLED.

The driving transistor DRT can drive the OLED by supplying driving current to the OLED.

The driving transistor DRT further has a second node N2 and a third node N3, in addition to the first node N1.

The first node N1 of the driving transistor DRT is a node corresponding to the gate node and is electrically connected to a source node or a drain node of the first transistor T1.

The second node N2 of the driving transistor DRT is electrically connected to the first electrode E1 of the OLED. The second node N2 of the driving transistor DRT may be a source node or a drain node.

The third node N3 of the driving transistor DRT is a node to which a driving voltage EVDD is applied, and is electrically connected to a driving voltage line DVL through which the driving voltage EVDD is supplied. The third node N3 of the driving transistor DRT may be a drain node or a source node.

The driving transistor DRT and the first transistor T1 may be embodied as n-type transistors or p-type transistors.

The first transistor T1 is electrically connected between a data line DL and the first node N1 of the driving transistor DRT. The first transistor T1 can be controlled by a scanning signal SCAN applied to the gate node of the first transistor T1 through a gate line.

The first transistor T1 can be turned on by the scanning signal SCAN to deliver the data voltage VDATA, supplied through the data line DL, to the first node of the driving transistor DRT.

The storage capacitor C1 is electrically connected between the first node N1 and the second node N2 of the driving transistor DRT.

The storage capacitor C1 is not a parasitic capacitor Cgs or Cgd, i.e., an internal capacitor present between the first node N1 and the second node N2 of the driving transistor DRT, but is an external capacitor intentionally designed to be disposed outside of the driving transistor DRT.

Referring to FIG. 3B, each of the subpixels SP on the display panel 110 according to exemplary embodiments further includes a second transistor T2, in addition to the OLED, the driving transistor DRT, the first transistor T1, and the storage capacitor C1.

Referring to FIG. 3B, the second transistor T2 is electrically connected between the second node N2 of the driving transistor DRT and a reference voltage line RVL through which a reference voltage VREF is supplied. The second transistor T2 can be controlled by a sensing signal SENSE, i.e., a scanning signal, supplied to the gate node of the second transistor T2.

Since the second transistor T2 is further provided, it is possible to effectively control the voltage status of the second node N2 of the driving transistor DRT in the subpixel SP.

The second transistor T2 can be turned on by the sensing signal SENSE to apply the reference voltage VREF, supplied through the reference voltage line RVL, to the second node N2 of the driving transistor DRT.

The subpixel structure illustrated in FIG. 3B is advantageous for accurately initializing the voltage of the second node N2 of the driving transistor DRT and sensing the unique characteristics (e.g., the threshold voltage or the degree of mobility) of the driving transistor DRT and the unique characteristics (e.g., the threshold voltage) of the OLED.

The scanning signal SCAN and the sensing signal SENSE may be separate gate signals. In this case, the scanning signal SCAN and the sensing signal SENSE may be applied to the gate node of the first transistor T1 and the gate node of the second transistor T2, respectively, through different gate lines.

Alternatively, the scanning signal SCAN and the sensing signal SENSE may be identical gate signals. In this case, the scanning signal SCAN and the sensing signal SENSE may be commonly applied to the gate node of the first transistor T1 and the gate node of the second transistor T2.

Figure 4:
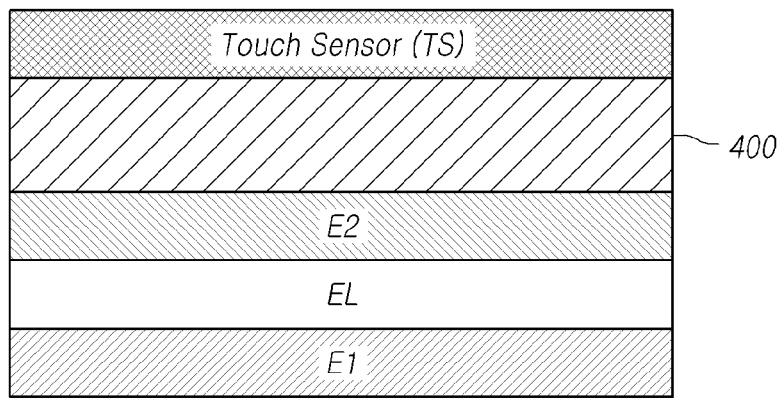
FIG. 4 illustrates the position of a touch sensor in the display panel according to exemplary embodiments.

FIG. 4 illustrates the position of a touch sensor TS in the display panel 110 according to exemplary embodiments.

Referring to FIG. 4, in the display panel 110 according to exemplary embodiments, the touch sensor TS may be directly disposed on an encapsulation layer 400 located on an OLED.

The encapsulation layer 400 is a layer protecting organic matter contained in an organic light-emitting layer EL from moisture, air, and the like. The encapsulation layer 400 is located on the second electrode E2 of the OLED that may act as the cathode.

The encapsulation layer 400 may be formed of a metal or an inorganic material or may have a multilayer structure in which one or more organic layers and one or more inorganic layers are stacked on each other.

The touch structure having the touch sensor TS disposed on the encapsulation layer 400 as described above is referred to as a touch-on-encapsulation (TOE) structure.

A color filter layer may be additionally disposed between the encapsulation layer 400 and the touch sensor TS or may be additionally disposed on the touch sensor TS.

Figure 5:
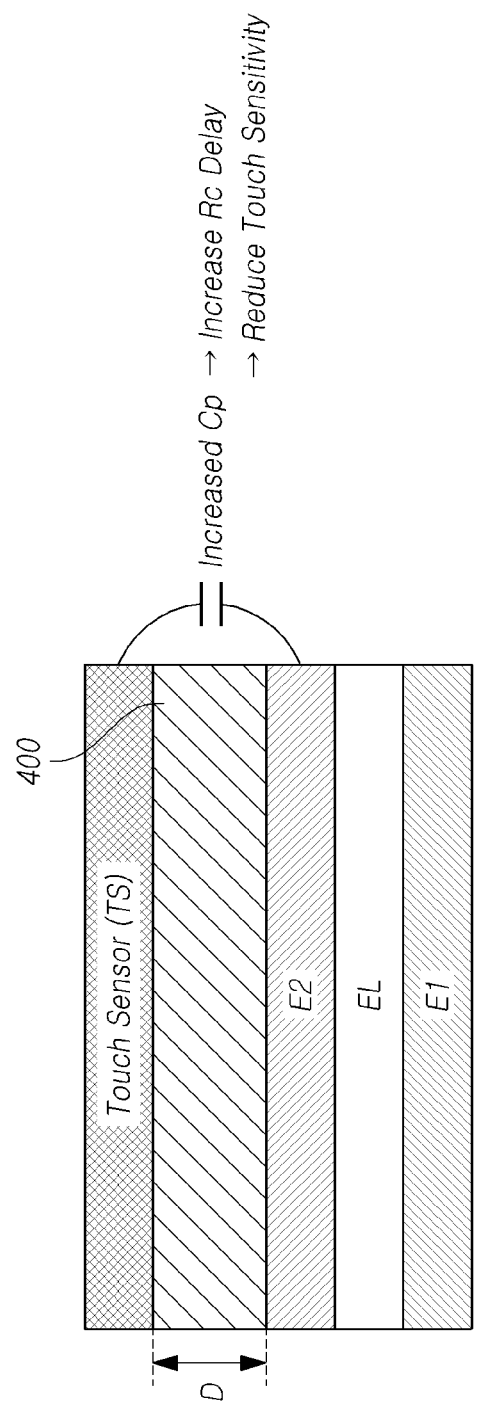
FIG. 5 illustrates parasitic capacitance formed between the touch sensor and the second electrode, as well as an influence of the parasitic capacitance on touch sensitivity, in the touch display device according to exemplary embodiments.

FIG. 5 illustrates parasitic capacitance Cp formed between the touch sensor TS and the second electrode E2, as well as an influence of the parasitic capacitance Cp on touch sensitivity, in the touch display device according to exemplary embodiments.

Referring to FIG. 5, a touch driving signal having a predetermined voltage level may be applied to the touch sensor TS during a touch sensing section.

This consequently causes a potential difference between the second electrode E2 and the touch sensor TS, thereby forming capacitance.

Capacitance for touch sensing is capacitance between touch sensors TS or capacitance between a touch sensor TS and a touch object (e.g., a finger or a stylus).

Thus, the capacitance formed between the second electrode E2 and the touch sensor TS is the parasitic capacitance Cp.

To embody the display panel 110 having the built-in touch panel TP, the touch panel TP may be provided as a built-in component in the display panel 110 by directly forming the touch sensor TS on the encapsulation layer 400, thereby significantly reducing the distance D between the second electrode E2 and the touch sensor TS.

However, this may consequently increase the parasitic capacitance Cp between the second electrode E2 and the touch sensor TS, thereby increasing resistive-capacitive (RC) delay.

In the display panel 110 according to exemplary embodiments, the distance D between the second electrode E2 and the touch sensor TS may be 5 μm or greater.

In this regard, the encapsulation layer 400 may be formed to have a thickness of 5 μm or greater.

As described above, the parasitic capacitance Cp between the second electrode E2 and the touch sensor TS can be reduced. This can consequently reduce RC delay, thereby improving touch sensitivity.

In one example, the thickness of the encapsulation layer 400 may be 5 μm or greater but to not exceed a maximum thickness (e.g., 10 μm-20 μm).

Figure 6:
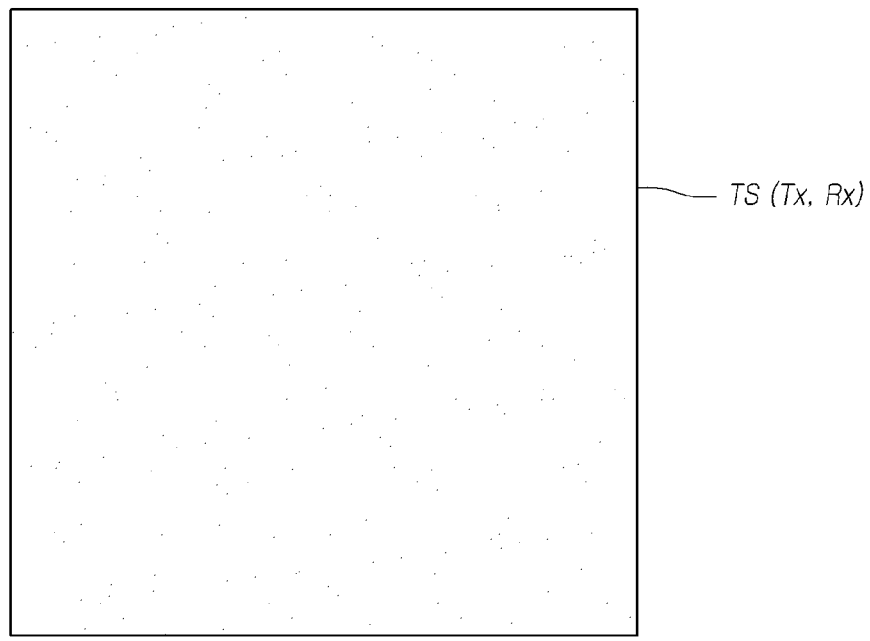
FIG. 6 illustrates an electrode type touch sensor without an open area in the touch display device according to exemplary embodiments.

FIG. 6 illustrates an electrode type touch sensor TS without an open area in the touch display device 100 according to exemplary embodiments.

In the touch display device 100, each touch sensor TS may be a transparent electrode without an open area. For example, the touch sensor TS includes amorphous transparent conductive materials formed by a low temperature deposition process at a process temperature of 100° C. or less.

In one embodiment, the touch sensor TS is designed to have a bulk structure (e.g., a bulk electrode type) without an open area OA as described above, such that the touch sensor TS can be easily patterned. In addition, when the touch sensor TS is implemented as a transparent electrode, the touch sensor TS without an influence on light-emitting performance in a subpixel area can be provided as a built-in component within the display panel 110.

Figure 7:
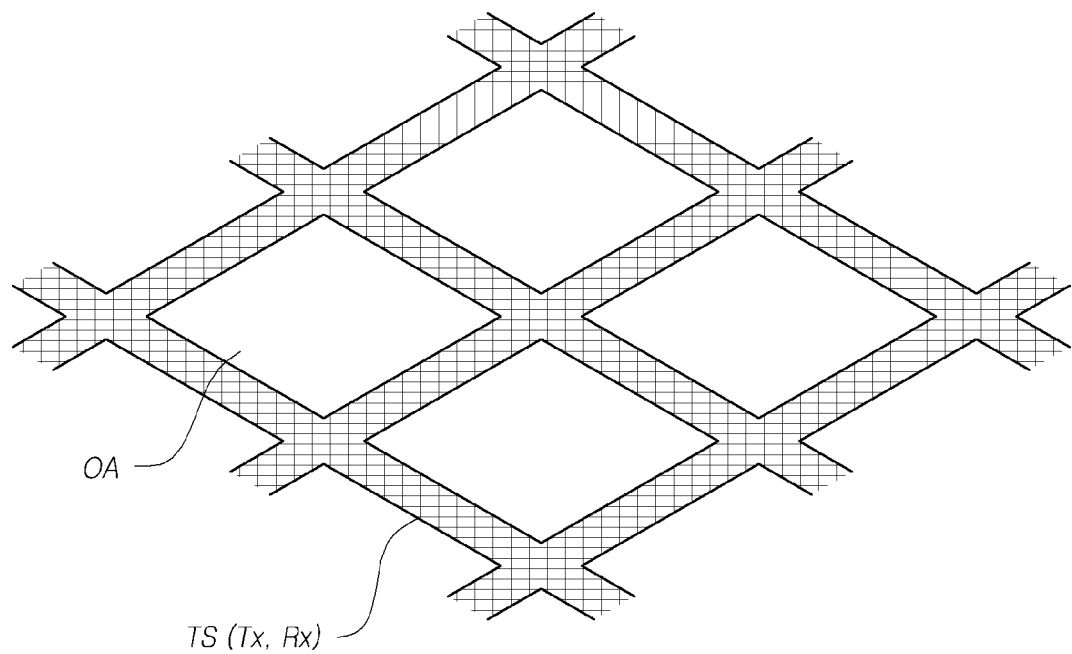
FIG. 7 illustrates an electrode type touch sensor having open areas in the touch display device according to exemplary embodiments.

FIG. 7 illustrates an electrode type touch sensor TS having open areas in the touch display device 100 according to exemplary embodiments.

In the touch display device 100, each touch sensor TS may be a mesh type electrode with one or more open areas OA.

The area of a single touch sensor TS, i.e., a single driving electrode Tx or a single sensing electrode Rx, may be greater than the area of a single subpixel.

For example, several or tens of subpixels may be present in the area of a single touch sensor TS.

In this case, each touch sensor TS may be an opaque electrode or a transparent electrode. For example, the touch sensor TS includes amorphous transparent conductive materials formed by a low temperature deposition process at a process temperature of 100° C. or less.

The open areas OA correspond to the light-emitting areas of the subpixels SP.

As described above, the touch sensor TS can be provided as a built-in component in the display panel 110 without lowering the light-emitting efficiency of each subpixel.

Hereinafter, a TOE structure capable of improving touch sensitivity by reducing RC delay will be described.

First, a TEO structure for mutual capacitance-based touch sensing will be described with reference to FIG. 8 to FIG. 24. Then, a TOE structure for self-capacitance-based touch sensing will be described with reference to FIG. 25 to FIG. 28.

Figure 8:
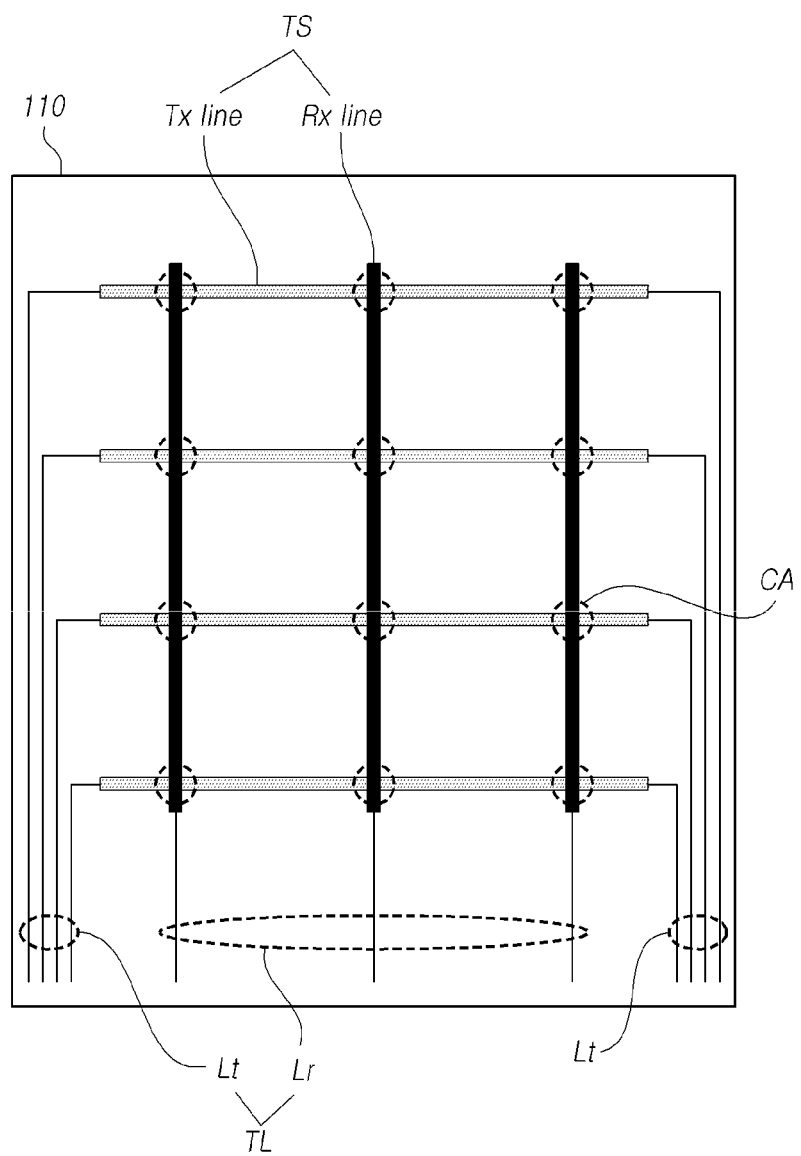
FIG. 8 illustrates an exemplary mutual capacitance-based touch panel according to exemplary embodiments.

FIG. 8 illustrates an exemplary mutual capacitance-based touch panel TP according to exemplary embodiments.

Referring to FIG. 8, when the touch display device 100 according to exemplary embodiments performs mutual capacitance-based touch sensing, touch sensors TS provided in the mutual capacitance-based touch panel TP include driving lines Tx line and receiving lines Rx line.

Referring to FIG. 8, each of the driving lines Tx line and the receiving lines Rx line has a line shape.

Referring to FIG. 8, signal lines TL are provided in the display panel 110. The signal lines TL are electrically connected to corresponding touch sensors TS.

The signal lines TL allow the touch sensors TS to be electrically connected to the touch sensing circuit 140.

Driving signal lines Lt are connected to the driving lines Tx line, respectively, while sensing signal lines Lr are connected to the receiving lines Rx line, respectively.

Referring to FIG. 8, in crossing areas CA, the driving lines Tx line must not be electrically connected to the receiving lines Rx line.

The driving lines Tx line and the receiving lines Rx line may be present on the same layer or different layers.

Figure 9:
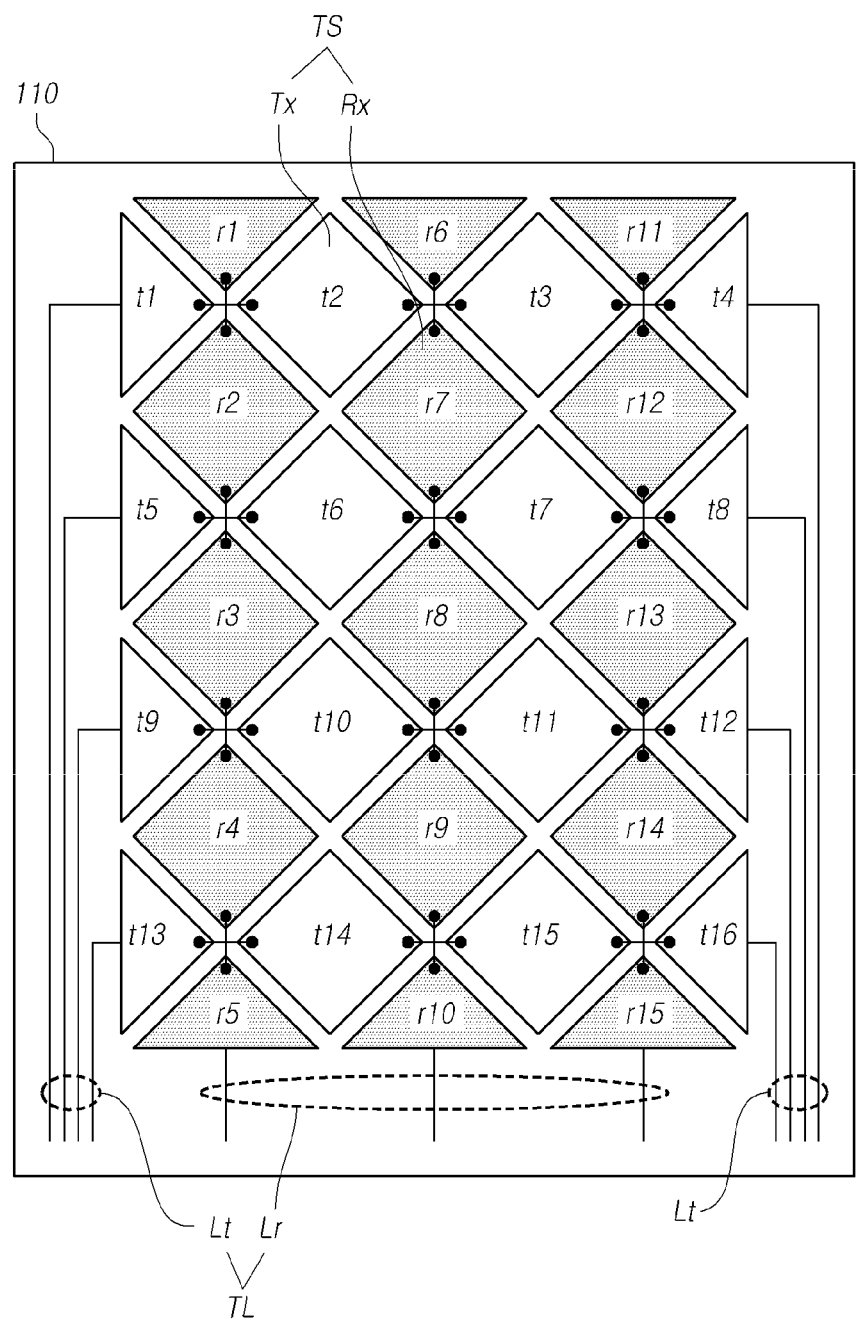
FIG. 9 illustrates another exemplary mutual capacitance-based touch panel according to exemplary embodiments.

FIG. 9 illustrates another exemplary mutual capacitance-based touch panel TP according to exemplary embodiments.

FIG. 9 illustrates an example of the structure in which driving electrodes Tx and sensing electrodes Rx are disposed on the same layer.

Referring to FIG. 9, touch sensors TX include driving electrodes Tx and sensing electrodes Tx.

Referring to FIG. 9, the driving electrodes Tx located on the same column or the same row are electrically connected via one or more driving bridges (or driving bridge patterns) Bt.

The electrically connected driving electrodes Tx correspond to a single driving line Tx line in FIG. 8.

For example, a driving electrode Tx at a point T1, a driving electrode Tx at a point t2, a driving electrode Tx at a point t3, and a driving electrode Tx at a point t4 are electrically connected by corresponding driving bridges Bt, thereby forming a single driving line Tx line. A driving electrode Tx at a point t5, a driving electrode Tx at a point t6, a driving electrode Tx at a point t7, and a driving electrode Tx at a point t8 are electrically connected by corresponding driving bridges Bt, thereby forming a single driving line Tx line. A driving electrode Tx at a point t9, a driving electrode Tx at a point t10, a driving electrode Tx at a point t11, and a driving electrode Tx at a point t12 are electrically connected by corresponding driving bridges Bt, thereby forming a single driving line Tx line. A driving electrode Tx at a point t13, a driving electrode Tx at a point t14, a driving electrode Tx at a point t15, and a driving electrode Tx at a point t16 are electrically connected by corresponding driving bridges Bt, thereby forming a single driving line Tx line.

At least one driving electrode among the driving electrodes Tx located on the same column or the same row is electrically connected to one or more driving signal lines Lt.

Referring to FIG. 9, the sensing electrodes Rx located on the same column or the same row are electrically connected via one or more sensing bridges (or sensing bridge patterns) Br.

The electrically connected sensing electrodes Rx correspond to a single receiving line Rx line in FIG. 8.

For example, a sensing electrode Rx at a point r1, a sensing electrode Rx at a point r2, a sensing electrode Rx at a point r3, a sensing electrode Rx at a point r4, and a sensing electrode Rx at a point r5 are electrically connected via corresponding sensing bridges Br, thereby forming a single receiving line Rx line. A sensing electrode Rx at a point r6, a sensing electrode Rx at a point r7, a sensing electrode Rx at a point r8, a sensing electrode Rx at a point r9, and a sensing electrode Rx at a point r10 are electrically connected via corresponding sensing bridges Br, thereby forming a single receiving line Rx line. A sensing electrode Rx at a point r11, a sensing electrode Rx at a point r12, a sensing electrode Rx at a point r13, a sensing electrode Rx at a point r14, and a sensing electrode Rx at a point r15 are electrically connected via corresponding sensing bridges Br, thereby forming a single receiving line Rx line.

At least one sensing electrode among the sensing electrodes Rx located on the same row or the same column is electrically connected to one or more sensing signal lines Lr corresponding thereto.

The touch sensing circuit 140 can supply touch driving signals to the driving signal lines Lt and sense a touch and/or a touched position based on touch sensing signals received through the sensing signal lines Lr.

As described above, when touch sensing is performed using the mutual capacitance-based touch structure, accurate touch sensing can be advantageously performed without ghosting or misplaced location sensing.

In the structure illustrated in FIG. 9, each of the touch sensors TS of the touch panel TP may be a bulk type touch electrode without an open area OA or a mesh type touch electrode having open areas OA.

Figure 10:
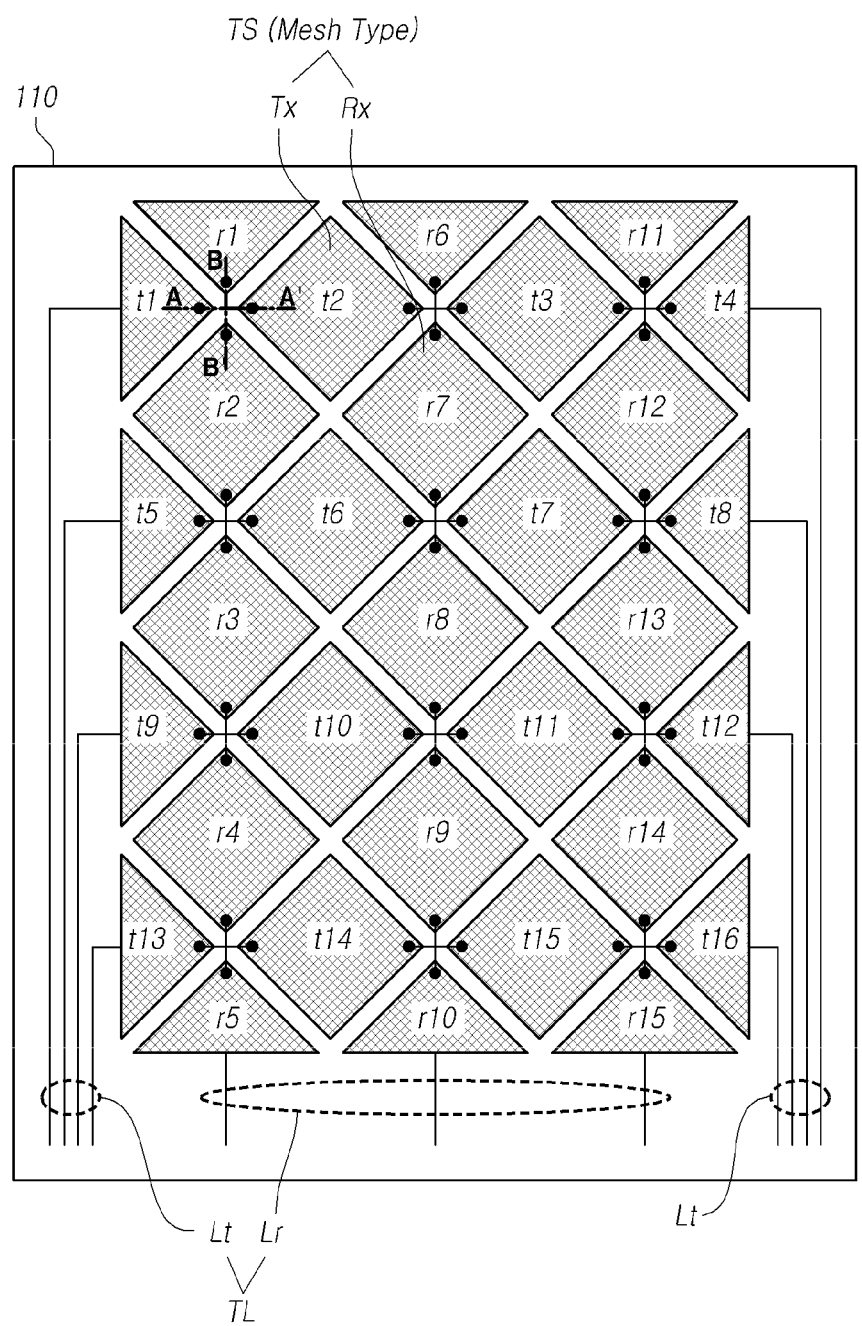
FIG. 10 illustrates further another exemplary mutual capacitance-based touch panel including touch sensors with open areas, according to exemplary embodiments.

FIG. 10 illustrates further another exemplary mutual capacitance-based touch panel TP according to exemplary embodiments.

Referring to FIG. 10, each of touch sensors TS of the touch panel TP is implemented as a mesh type touch electrode having open areas OA.

Hereinafter, a TOE structure able to improve touch sensitivity by reducing RC delay in a mutual capacitance-based touch sensing structure including mesh type touch sensors TS having open areas will be described with reference to FIG. 11 to FIG. 21.

Figure 11:
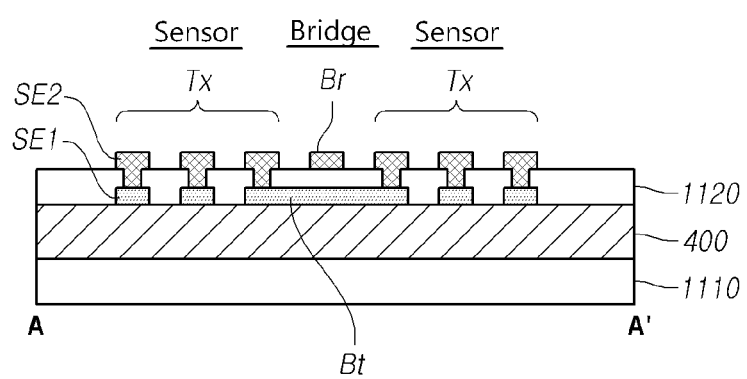
FIG. 11 is a cross-sectional view taken along line A-A' in the touch panel illustrated in FIG. 10.
Figure 12:
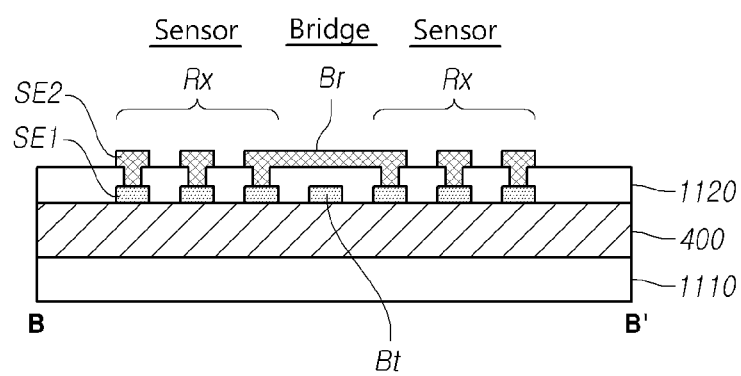
FIG. 12 is a cross-sectional view taken along line B-B' in the touch panel illustrated in FIG. 10.

FIG. 11 is a cross-sectional view taken along line A-A' in the touch panel TP illustrated in FIG. 10, and FIG. 12 is a cross-sectional view taken along line B-B' in the touch panel TP illustrated in FIG. 10.

Referring to FIG. 11 and FIG. 12, in the display panel 110, the encapsulation layer 400 is located on a second electrode layer 1110 on which the second electrode E2 acting as the cathode is located.

Touch sensors TS used for touch sensing may be located directly on the encapsulation layer 400.

Each of the touch sensors TS is comprised of two or more sub-electrodes SE1 and SE2.

The two or more sub-electrodes SE1 and SE2 are electrically connected.

Regarding the mutual capacitance-based touch sensing structure, the touch sensors TS are categorized as driving electrodes Tx and sensing electrodes Rx.

Referring to FIG. 11, a single driving electrode Tx is comprised of two or more sub-electrodes SE1 and SE2.

The two or more sub-electrodes SE1 and SE2 of the single driving electrode Tx are located on different layers.

The two or more sub-electrodes SE1 and SE2 of the single driving electrode Tx are electrically connected via a contact hole extending through an insulation layer 1120.

Referring to FIG. 12, a single sensing electrode Rx is comprised of two or more sub-electrodes SE1 and SE2.

The two or more sub-electrodes SE1 and SE2 of the single sensing electrode Rx are located on different layers.

The two or more sub-electrodes SE1 and SE2 of the single driving electrode Tx are electrically connected via a contact hole extending through the insulation layer 1120.

Referring to FIG. 10, in the area in which the line A-A' crosses the line B-B', two driving electrodes Tx are electrically connected, and two sensing electrodes Rx are electrically connected.

Referring to FIG. 11, the driving electrode Tx located at a point A and the driving electrode Tx located at a point A' are electrically connected via a driving bridge Bt formed of the same material as the first sub-electrode SE1.

Specifically, the first sub-electrode SE1 of the driving electrode Tx located at the point A and the first sub-electrode SE1 of the driving electrode Tx located at the point A' are electrically connected via the driving bridge Bt formed of the material of the first sub-electrode.

Referring to FIG. 12, the sensing electrode Rx located at a point B and the sensing electrode Rx located at a point B' are electrically connected via a sensing bridge Br formed of the same material as the second sub-electrode SE2.

Specifically, the second sub-electrode SE2 of the sensing electrode Rx located at the point B and the second sub-electrode SE2 of the sensing electrode Rx located at the point B' are electrically connected via the sensing bridge Br formed of the material of the second sub-electrode SE2.

The driving bridge Bt and the sensing bridge Br are located on different sub-electrode layers.

For example, the driving bridge Bt may be located on a first sub-electrode layer on which the first sub-electrode SE1 is disposed, while the sensing bridge Br may be located on a second sub-electrode layer on which the second sub-electrode SE2 is disposed.

As described above, in the TEO structure in which the touch sensors TS are disposed on the encapsulation layer 400, the touch sensors TS have a multi-electrode structure comprised of the first and second sub-electrodes SE1 and SE2, such that the resistance of the touch sensors TS can be significantly reduced. This can consequently improve touch sensitivity by reducing RC delay in the TOE structure having the touch sensors TS disposed on the encapsulation layer 400 in which RC delay would otherwise be inevitably increased.

In addition, in the display panel 110, pads (not shown) connecting the signal lines TL to the touch sensing circuit 140 may be formed of the same material as one of the two or more sub-electrodes SE1 and SE2.

Figure 13:
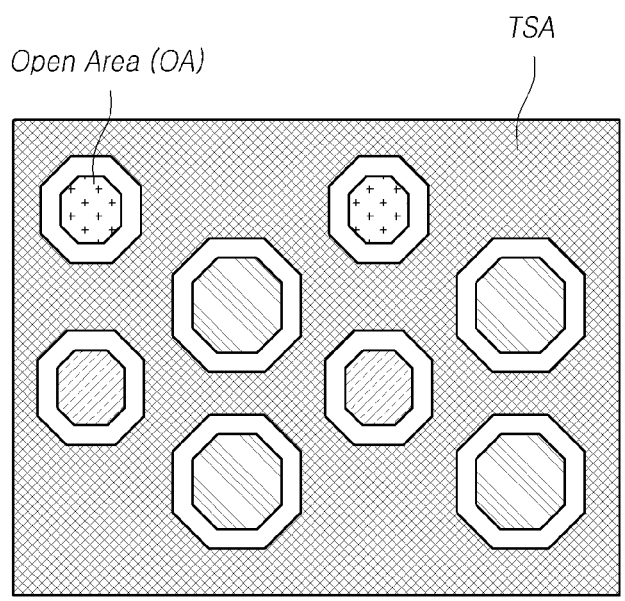
FIG. 13 and FIG. 14 illustrate open areas of a touch sensor and light-emitting areas in the touch display device according to exemplary embodiments.
Figure 14:
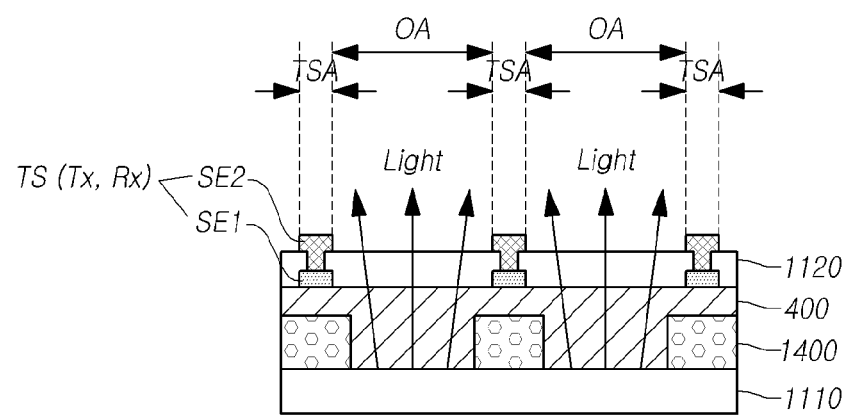

FIG. 13 and FIG. 14 illustrate open areas of a touch sensor TS and light-emitting areas in the touch display device 100 according to exemplary embodiments.

Referring to FIG. 13 and FIG. 14, a single touch sensor TS is formed in an area TSA of a plurality of subpixels, except for the light-emitting areas of the subpixels.

Thus, a single touch sensor TS includes a plurality of open areas OA, each of which corresponds to a light-emitting area of a single subpixel defined by banks 1400.

Figure 15:
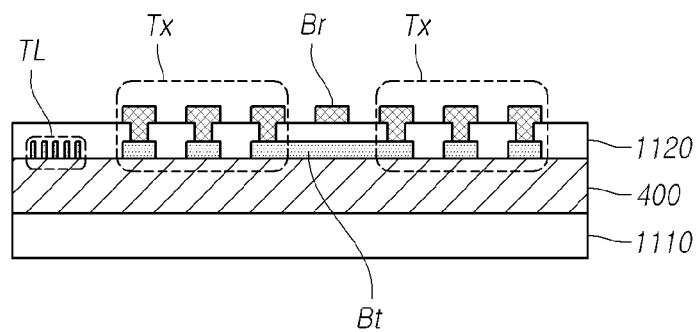
FIG. 15 illustrates a multi-electrode structure of touch sensors and a single line structure of signal lines in the touch display device according to exemplary embodiments.
Figure 16:
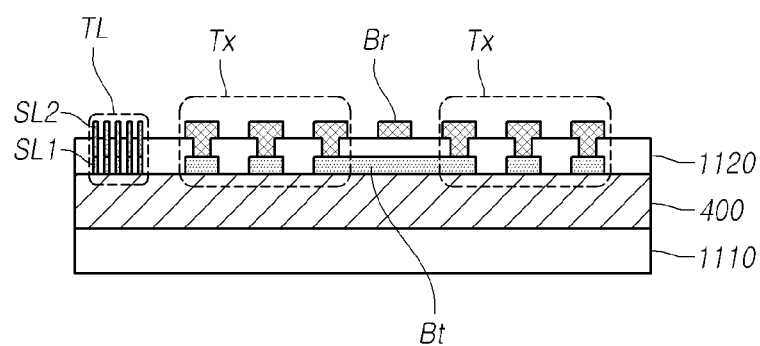
FIG. 16 illustrates a multi-electrode structure of touch sensors and a multi-line structure of signal lines in the touch display device according to exemplary embodiments.

FIG. 15 illustrates a multi-electrode structure of touch sensors TS and a single line structure of signal lines in the touch display device 100 according to exemplary embodiments, and FIG. 16 illustrates a multi-electrode structure of touch sensors TS and a multi-line structure of signal lines in the touch display device 100 according to exemplary embodiments.

Referring to FIG. 15 and FIG. 16, signal lines TL electrically connecting the plurality of touch sensors TS to the touch sensing circuit 140 are also disposed on the encapsulation layer 400.

Since the signal lines TL are disposed on the encapsulation layer 400 as described above, a complete TOE structure can be provided.

The signal lines TL may have a single-line structure as illustrated in FIG. 15 or may have a multi-line structure as illustrated in FIG. 16.

When the signal lines TL have a multi-line structure, each of the signal lines TL is comprised of two or more sub-lines SL1 and SL2, as illustrated in FIG. 16.

Since each of the signal lines TL is comprised of two or more sub-lines SL1 and SL2 as described above, the resistance of the signal line TL can be reduced. This can consequently reduce RC delay and improve signal transmission performance.

Hereinafter, a method of forming touch sensors and signal lines in the TOE structure illustrated in FIG. 16 will be described with respect to a case in which each of the driving electrodes Tx and the sensing electrodes Rx corresponding to the touch sensors TS is comprised of two sub-electrodes SE1 and SE2 and each of the driving signal lines Lt and the sensing signal lines Lr corresponding to the signal lines TL is comprised of two sub-lines SL1 and SL2.

(1) The first sub-electrodes SE1 of the driving electrodes Tx and the sensing electrodes Rx corresponding to the touch sensors TS, the driving bridges Bt connecting the first sub-electrodes SE1 of adjacent driving electrodes Tx, and the first sub-lines SL1 of the driving signal lines Lt and the sensing signal lines Lr corresponding to the signal lines TL are formed on the encapsulation layer 400.

(2) The insulation layer 1120 is formed on the first sub-electrodes SE1, the driving bridges Bt, and the first sub-lines SL1.

(3) The second sub-electrodes SE2 of the driving electrodes Tx and the sensing electrodes Rx corresponding to the touch sensors TS, the sensing bridges Br connecting the second sub-electrodes SE2 of adjacent driving electrodes Tx, and the second sub-lines SL2 of the driving signal lines Lt and the sensing signal lines Lr corresponding to the signal lines TL are formed on the insulation layer 1120.

Here, the second sub-electrodes SE2 are electrically connected to the first sub-electrodes SE1 via contact holes formed in the insulation layer 1120.

Figure 17:
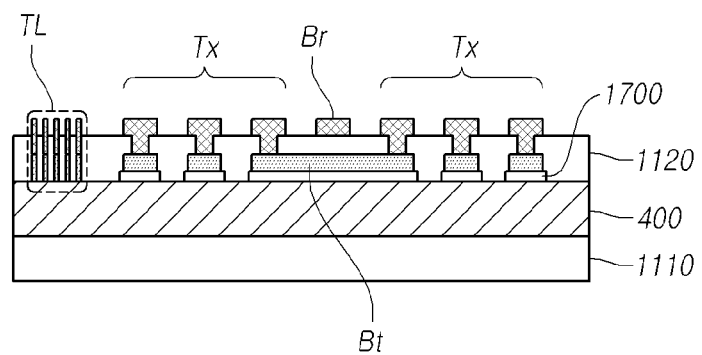
FIG. 17 and FIG. 18 illustrate an exemplary structure for improving the sensitivity of touch sensors in the touch display device according to exemplary embodiments.
Figure 18:
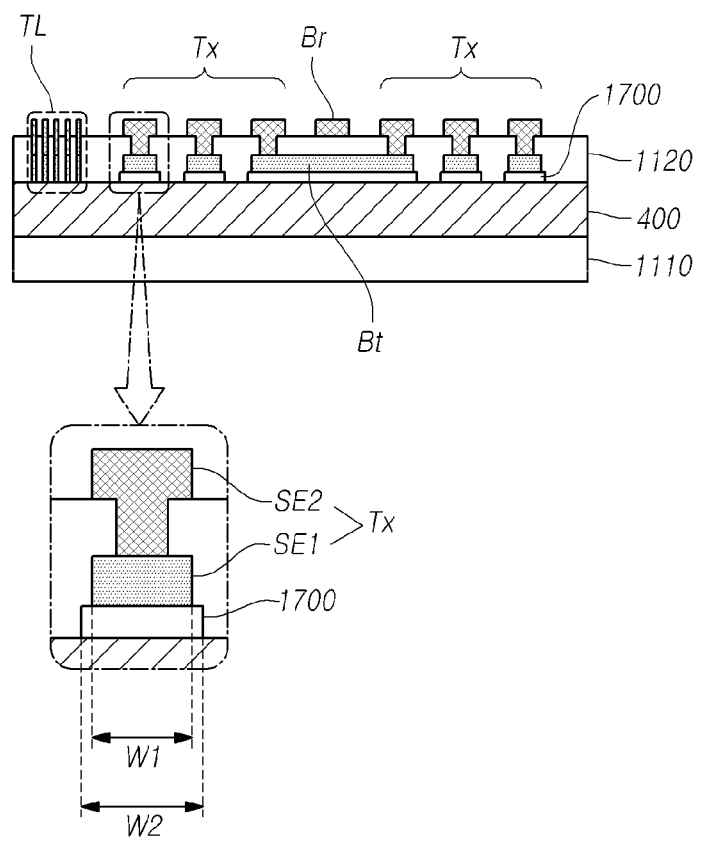

FIG. 17 and FIG. 18 illustrate an exemplary structure for improving the sensitivity of the touch sensors TS in the touch display device 100 according to exemplary embodiments.

Referring to FIG. 17, transparent electrodes 1700 are disposed below the touch sensors TS.

Specifically, each of the transparent electrodes 1700 is disposed between the encapsulation layer 400 and the first sub-electrode SE1 of the touch sensor TS corresponding thereto.

Alternatively, the transparent electrodes 1700 may be disposed on the touch sensors TS. Specifically, each of the transparent electrodes 1700 may be disposed on the uppermost sub-electrode (SE2 in FIG. 17) among the two or more sub-electrodes of the touch sensor TS corresponding thereto.

Alternatively, each of the transparent electrodes 1700 may be disposed between the two or more sub-electrodes of the touch sensor TS corresponding thereto.

Since each touch sensor TS is comprised of two or more sub-electrodes SE1 and SE2 and a transparent electrode 1700 as described above, resistance can be further reduced. For example, when two or more sub-electrodes SE1 and SE2 of each touch sensor TS are opaque, the resistance of each touch sensor TS may be reduced due to the transparent electrode 1700.

Referring to FIG. 18, the area of the transparent electrode 1700 is greater than the area of either the first sub-electrode SE1 or the second sub-electrode SE2. Here, the width W2 of the transparent electrode 1700 is greater than the width W1 of either the first sub-electrode SE1 or the second sub-electrode SE2.

The above-described structure of the transparent electrodes 1700 can increase the substantial area of the touch sensors TS without reducing the light-emitting areas. This can consequently increase capacitance associated with touch sensing, thereby improving touch sensitivity.

The above-described structure of the transparent electrodes 1700 is applicable to both the mutual capacitance-based touch structure and the self-capacitance-based touch structure.

Figure 19:
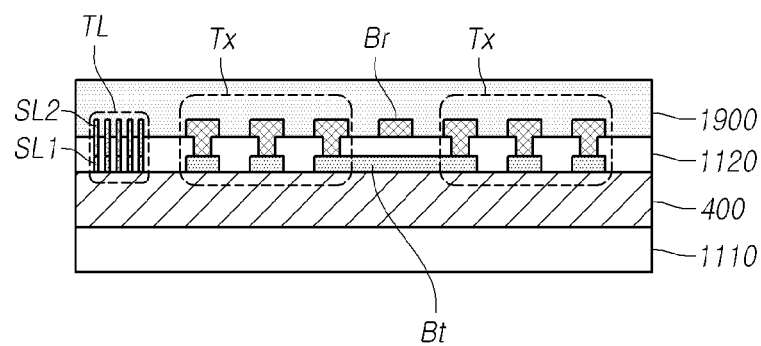
FIG. 19 illustrates an exemplary structure for protecting touch sensors in the touch display device according to exemplary embodiments.

FIG. 19 illustrates an exemplary structure for protecting the touch sensors TS in the touch display device 100 according to exemplary embodiments.

Referring to FIG. 19, a passivation layer 1900 is disposed on the touch sensors TS.

The passivation layer 1900 is able to protect the underlying touch sensors TS.

Figure 20:
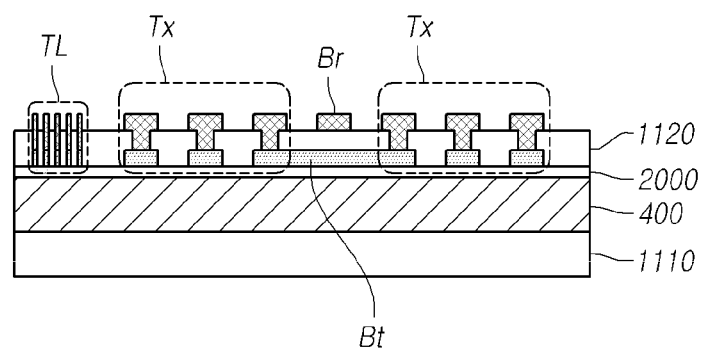
FIG. 20 illustrates an exemplary interlayer protection structure in the touch display device according to exemplary embodiments.

FIG. 20 illustrates an exemplary interlayer protection structure in the touch display device 100 according to exemplary embodiments.

Referring to FIG. 20, a buffer layer 2000 is disposed between the encapsulation layer 400 and the touch sensors TS.

The buffer layer 2000 may be formed of an organic material or an inorganic material.

The buffer layer 2000 can prevent the encapsulation layer 400 from being damaged by the touch sensors TS formed of metal during or after the fabrication of the panel.

Figure 21:
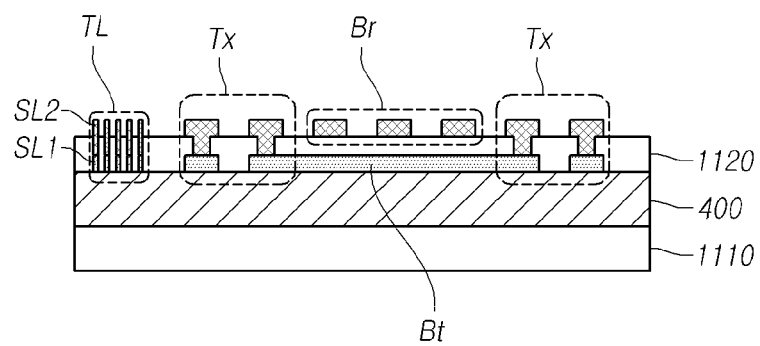
FIG. 21 illustrates an example of modified bridges in the touch display device according to exemplary embodiments.

FIG. 21 illustrates an example of modified bridges in the touch display device 100 according to exemplary embodiments.

While two touch sensors are electrically connected via a single bridge Br as illustrated in FIG. 11, two or more bridges Br may be provided as illustrated in FIG. 21.

This configuration can reduce the resistance of the bridges Br, thereby improving signal transmission performance.

Hereinafter, a TOE structure able to improve touch sensitivity by reducing RC delay in a mutual capacitance-based touch sensing structure including bulk type touch sensors TS without an open area will be described with reference to FIG. 22 to FIG. 24.

Figure 22:
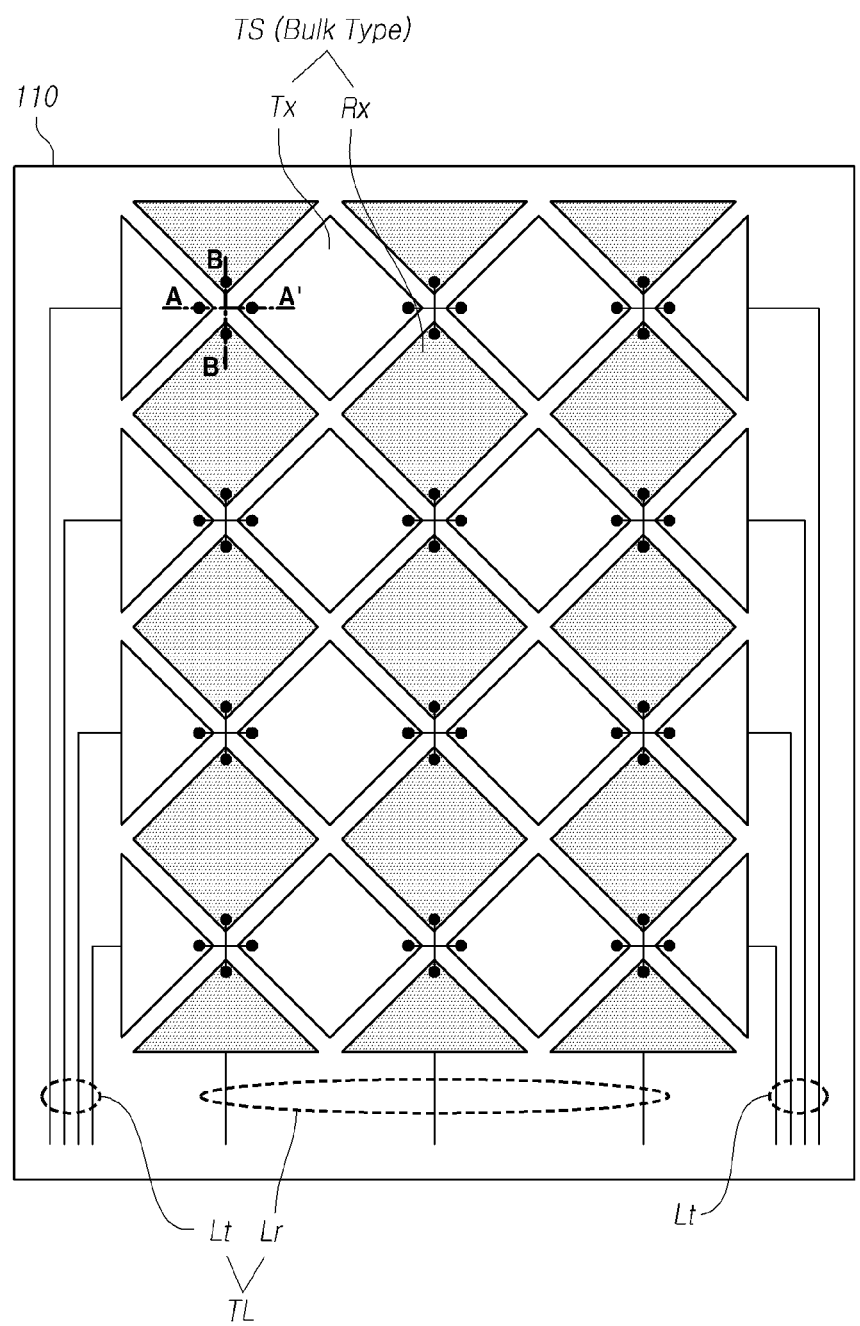
FIG. 22 illustrates another exemplary mutual capacitance-based touch panel including touch sensors without an open area, according to exemplary embodiments.
Figure 23:
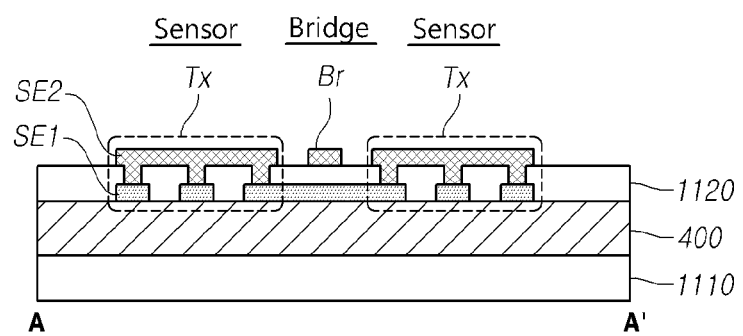
FIG. 23 is a cross-sectional view taken along line A-A' in the touch panel illustrated in FIG. 22.
Figure 24:
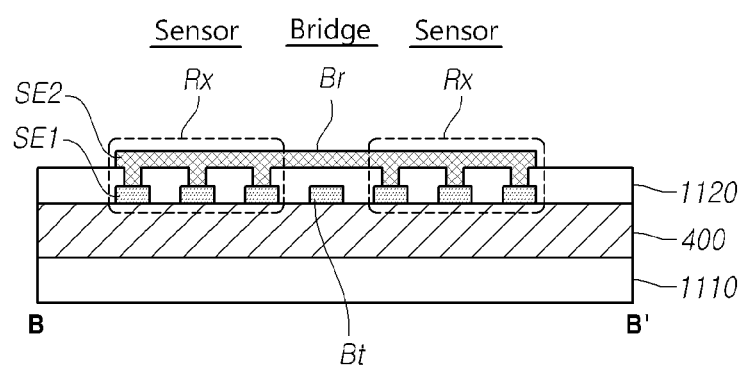
FIG. 24 is a cross-sectional view taken along line B-B' in the touch panel illustrated in FIG. 22.

FIG. 22 illustrates another exemplary mutual capacitance-based touch panel TP in which electrode type touch sensors TS without an open area are disposed, according to exemplary embodiments, FIG. 23 is a cross-sectional view taken along line A-A' in the touch panel TP illustrated in FIG. 22, and FIG. 24 is a cross-sectional view taken along line B-B' in the touch panel TP illustrated in FIG. 22.

The cross-section illustrated in FIG. 23 is substantially the same as the cross-section illustrated in FIG. 11, except that the driving electrodes Tx do not have open areas OA.

In each of the driving electrodes Tx, the first sub-electrode SE1 and the second sub-electrode SE2 may be in contact with each other at several points or over the entirety of the surface thereof.

The cross-section illustrated in FIG. 24 is substantially the same as the cross-section illustrated in FIG. 12, except that the sensing electrodes Rx do not have open areas OA.

In each of the sensing electrodes Rx, the first sub-electrode SE1 and the second sub-electrode SE2 may be in contact with each other at several points or the entirety of the surface thereof.

Hereinafter, a TOE structure able to improve touch sensitivity by reducing RC delay in a self-capacitance-based touch sensing structure including mesh type touch sensors TS having open areas will be described with reference to FIG. 25 and FIG. 26.

Figure 25:
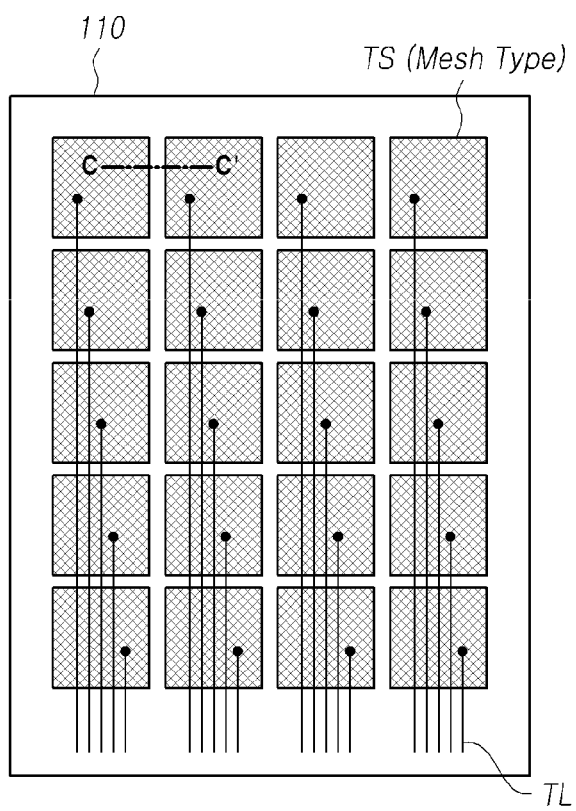
FIG. 25 illustrates an exemplary self-capacitance-based touch panel including touch sensors with open areas, according to exemplary embodiments.

FIG. 25 illustrates an exemplary self-capacitance-based touch panel TP in which electrode type touch sensors TS having open areas are disposed, according to exemplary embodiments.

Referring to FIG. 25, the built-in touch sensors TS of the display panel 110 are electrically isolated from each other.

In the display panel 110, signal lines TL are electrically connected to the touch sensors TS and are electrically isolated from each other.

The touch sensing circuit 140 can supply touch driving signals to the signal lines TL and can sense a touch or a touched position based on touch sensing signals received from the signal lines TL.

The application of the self-capacitance-based touch structure as described above can advantageously facilitate the arrangement of the touch sensors on a single layer, thereby reducing the thickness of the display panel 110 provided with the built-in touch panel. Consequently, self-capacitance-based touch sensing can be driven and performed more simply while being more resistant to noise, compared to mutual capacitance-based touch sensing.

Figure 26:
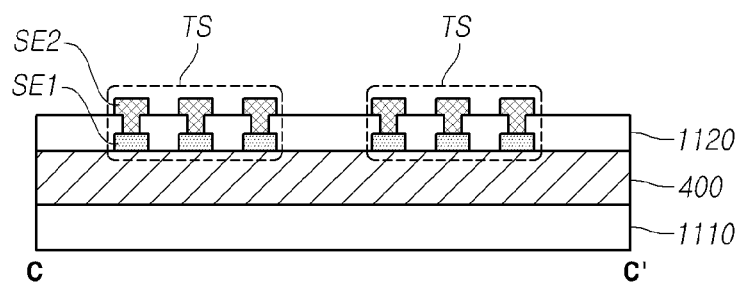
FIG. 26 is a cross-sectional view taken along line C-C' in the touch panel illustrated in FIG. 25.

FIG. 26 is a cross-sectional view taken along line C-C' in the touch panel TP illustrated in FIG. 25.

Referring to FIG. 26, in the display panel 110, the encapsulation layer 400 is located on a second electrode layer 1110 on which the second electrode E2 acting as the cathode is located.

The touch sensors TS for self-capacitance-based touch sensing are located on the encapsulation layer 400.

Each of the touch sensors TS is comprised of two or more sub-electrodes SE1 and SE2.

The two or more sub-electrodes SE1 and SE2 of the single touch sensor TS are electrically connected.

The two or more sub-electrodes SE1 and SE2 of the single touch sensor TS are electrically connected via a contact hole extending through an insulation layer 1120.

Hereinafter, a TOE structure able to improve touch sensitivity by reducing RC delay in a self-capacitance-based touch sensing structure including bulk type touch sensors TS without an open area will be described with reference to FIG. 27 and FIG. 28.

Figure 27:
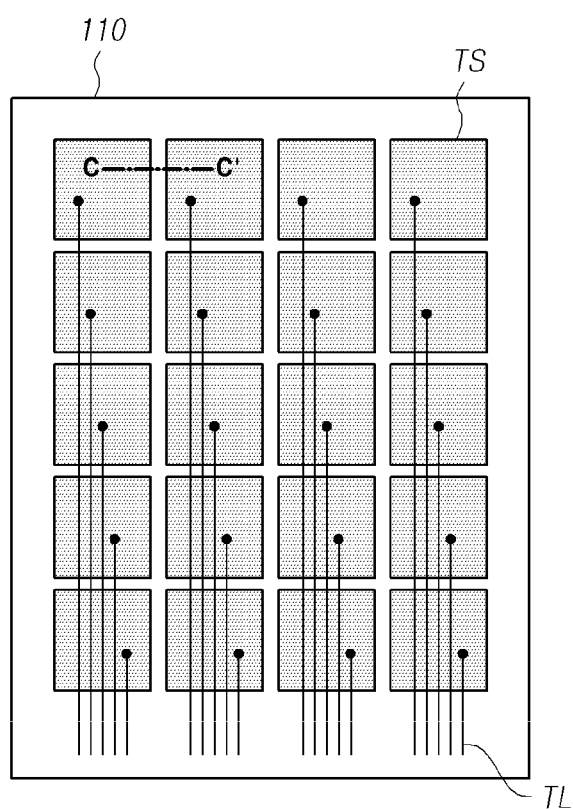
FIG. 27 illustrates an exemplary self-capacitance-based touch panel in which electrode type touch sensors without an open area are disposed, according to exemplary embodiments.
Figure 28:
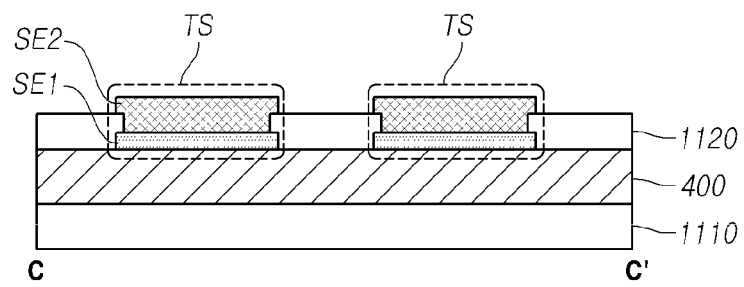
FIG. 28 is a cross-sectional view taken along line C-C' in the touch panel illustrated in FIG. 27.

FIG. 27 illustrates an exemplary self-capacitance-based touch panel TP in which electrode type touch sensors TS without an open area are disposed, according to exemplary embodiments, and FIG. 28 is a cross-sectional view taken along line C-C' in the touch panel TP illustrated in FIG. 27.

Referring to FIG. 28, in the display panel 110, the encapsulation layer 400 is located on a second electrode layer 1110 on which the second electrode E2 acting as the cathode is located.

The touch sensors TS for self-capacitance-based touch sensing are located on the encapsulation layer 400.

Each of the touch sensors TS is comprised of two or more sub-electrodes SE1 and SE2.

The two or more sub-electrodes SE1 and SE2 of the single touch sensor TS are electrically connected.

The two or more sub-electrodes SE1 and SE2 of the single touch sensor TS are electrically connected via a contact hole extending through an insulation layer 1120.

Referring to FIG. 28, the bulk type touch sensors TS without an open area may be transparent electrodes.

According to exemplary embodiments as set forth above, the use of the TOE structure able to reduce RC delay can improve touch sensitivity.

In addition, the TOE structure able to reduce RC delay can facilitate the fabrication of large panels.

Furthermore, the TOE structure able to reduce RC delay allows mobile devices and wearable devices to be thinner and allows touch sensitivity of such devices to be improved.

The foregoing descriptions and the accompanying drawings have been presented in order to explain the certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended claims and their equivalents fall within the scope of the disclosure.

What is claimed is:

1. A touch display device comprising:
a display panel comprising data lines, gate lines, subpixels defined by the data lines and the gate lines, touch sensors, and signal lines electrically connected to at least a subset of the touch sensors; and
a touch sensing circuit sensing a touch or a touched position using the touch sensors,
wherein each of the touch sensors is located on an encapsulation layer and comprises two or more sub-electrodes located on different layers, the two or more sub-electrodes electrically connected to each other, and
wherein at least a part of each of the signal lines comprises a first sub-line, and a second sub-line on the first sub-line electrically connected to the first sub-line.

2. The touch display device according to claim 1, wherein one of the two or more sub-electrodes is disposed directly on the encapsulation layer.

3. The touch display device according to claim 1, wherein the encapsulation layer is disposed between one of the two or more sub-electrodes and an organic light emitting diode.

4. The touch display device according to claim 1, wherein the signal lines are located on the encapsulation layer.

5. The touch display device according to claim 1, wherein each of the signal lines comprises two or more sub-lines.

6. The touch display device according to claim 1,
wherein the touch sensors are electrically isolated from each other, each of the touch sensors being electrically connected to a corresponding signal line, and
wherein the touch sensing circuit supplies touch driving signals to the signal lines and senses the touch or the touched position based on touch sensing signals received through the signal lines in response to the touch driving signals.

7. The touch display device according to claim 1, wherein each of the touch sensors comprises a transparent electrode without any open area within the transparent electrode.

8. The touch display device according to claim 1, wherein each of the touch sensors comprises a mesh type electrode having one or more open areas, each of the one or more open areas corresponding to a corresponding light-emitting area of the subpixels.

9. The touch display device according to claim 1, wherein a passivation layer is located on the touch sensors.

10. The touch display device according to claim 1, wherein a buffer layer is disposed between (i) the encapsulation layer and (ii) the touch sensors.

11. A touch display device comprising:
a display panel comprising data lines, gate lines, subpixels defined by the data lines and the gate lines, and touch sensors; and
a touch sensing circuit sensing a touch or a touched position using the touch sensors,
wherein each of the touch sensors is located on an encapsulation layer and comprises two or more sub-electrodes located on different layers, the two or more sub-electrodes electrically connected to each other, and
wherein the touch sensors include amorphous transparent conductive materials formed by a low temperature deposition process at a process temperature of 100 C.° or less.

12. A touch display device comprising:
a display panel comprising data lines, gate lines, subpixels defined by the data lines and the gate lines, and touch sensors; and
a touch sensing circuit sensing a touch or a touched position using the touch sensors,
wherein each of the touch sensors is located on an encapsulation layer and comprises two or more sub-electrodes located on different layers, the two or more sub-electrodes electrically connected to each other,
wherein the touch sensors comprise driving electrodes and sensing electrodes, wherein two or more of the driving electrodes disposed in a first direction are electrically connected to each other via one or more driving bridges, the two or more of the driving electrodes electrically connected to a corresponding driving signal line, wherein two or more of the sensing electrodes disposed in a second direction are electrically connected to each other via one or more sensing bridges, the two or more of the sensing electrodes electrically connected to a corresponding sensing signal line, and wherein the one or more driving bridges and the one or more sensing bridges are located on different layers of the two or more sub-electrodes, and
wherein the touch sensing circuit supplies touch driving signals to driving signal lines and senses the touch or the touched position based on touch sensing signals received through sensing signal lines in response to the touch driving signals.

13. A touch display device comprising:
a display panel comprising data lines, gate lines, subpixels defined by the data lines and the gate lines, and touch sensors; and
a touch sensing circuit sensing a touch or a touched position using the touch sensors,
wherein each of the touch sensors is located on an encapsulation layer and comprises two or more sub-electrodes located on different layers, the two or more sub-electrodes electrically connected to each other, and
wherein a transparent electrode is disposed on or below a corresponding one of the touch sensors or is disposed between two sub-electrodes from the two or more sub-electrodes of the corresponding one of the touch sensors.

14. The touch display device according to claim 13, wherein the transparent electrode has a greater area than the two or more sub-electrodes.

15. A touch display panel comprising:
subpixels defined by data lines and gate lines, each subpixel including:
an organic light-emitting diode comprising a first electrode, an organic light-emitting layer, and a second electrode, and
a driving transistor for driving the organic light-emitting diode;
an encapsulation layer located on the second electrode of the organic light-emitting diode;
touch sensors for touch sensing disposed on the encapsulation layer, each of the touch sensors comprising two or more sub-electrodes located on different layers, the two or more sub-electrodes electrically connected to each other; and
signal lines electrically connected to at least a subset of the touch sensors,
wherein at least a part of each of the signal lines comprises a first sub-line, and a second sub-line on the first sub-line electrically connected to the first sub-line.

16. The touch display panel according to claim 15, wherein one of the two or more sub-electrodes is disposed directly on the encapsulation layer.

17. The touch display panel according to claim 15, wherein the encapsulation layer is disposed between one of the two or more sub-electrodes and the organic light emitting diode.

18. The touch display panel according to claim 15, wherein a passivation layer is located on the touch sensors.

19. The touch display panel according to claim 15, wherein a buffer layer is disposed between (i) the encapsulation layer and (ii) the touch sensors.

20. The touch display panel according to claim 15, wherein a thickness of the encapsulation layer is 5 μm to 20 μm.

21. A touch display panel comprising:
subpixels defined by data lines and gate lines, each subpixel including:
an organic light-emitting diode comprising a first electrode, an organic light-emitting layer, and a second electrode, and
a driving transistor for driving the organic light-emitting diode;
an encapsulation layer located on the second electrode of the organic light-emitting diode; and
touch sensors for touch sensing disposed on the encapsulation layer, each of the touch sensors comprising two or more sub-electrodes located on different layers, the two or more sub-electrodes electrically connected to each other,
wherein the touch sensors include amorphous transparent conductive materials formed by a low temperature deposition process at a process temperature of 100 C.° or less.

22. A touch display panel comprising:
subpixels defined by data lines and gate lines, each subpixel including:
an organic light-emitting diode comprising a first electrode, an organic light-emitting layer, and a second electrode, and
a driving transistor for driving the organic light-emitting diode;
an encapsulation layer located on the second electrode of the organic light-emitting diode; and
touch sensors for touch sensing disposed on the encapsulation layer, each of the touch sensors comprising two or more sub-electrodes located on different layers, the two or more sub-electrodes electrically connected to each other, and
wherein a transparent electrode is disposed on or below a corresponding one of the touch sensors or is disposed between two sub-electrodes from the two or more sub-electrodes of the corresponding one of the touch sensors.

23. The touch display panel according to claim 22, wherein the transparent electrode has a greater area than the two or more sub-electrodes.

* * * * *